(12) United States Patent
Lee et al.

(10) Patent No.: US 9,066,184 B2
(45) Date of Patent: Jun. 23, 2015

(54) ACOUSTIC SENSOR AND FABRICATION METHOD THEREOF

(75) Inventors: Jae Woo Lee, Daejeon (KR); Chang Han Je, Daejeon (KR); Woo Seok Yang, Daejeon (KR); Jong Dae Kim, Daejeon (KR)

(73) Assignee: ELECTRONICS & TELECOMMUNICATIONS RESEARCH INSTITUTE, Daejeon (KR)

(*) Notice: Subject to any disclaimer, the term of this patent is extended or adjusted under 35 U.S.C. 154(b) by 410 days.

(21) Appl. No.: 13/557,108

(22) Filed: Jul. 24, 2012

(65) Prior Publication Data

US 2013/0100779 A1 Apr. 25, 2013

(30) Foreign Application Priority Data

Oct. 24, 2011 (KR) .................. 10-2011-0108577

(51) Int. Cl.
*H04R 31/00* (2006.01)
*H04R 19/00* (2006.01)
*H04R 19/04* (2006.01)

(52) U.S. Cl.
CPC .......... *H04R 19/005* (2013.01); *Y10T 29/49005* (2015.01); *H04R 31/00* (2013.01); *H04R 19/04* (2013.01)

(58) Field of Classification Search
CPC ....... H04R 31/00; H04R 19/005; H04R 19/04
USPC ........................................ 367/188
See application file for complete search history.

(56) References Cited

U.S. PATENT DOCUMENTS

| 4,236,051 | A | * | 11/1980 | Nakagawa et al. | 381/191 |
| 4,321,432 | A | * | 3/1982 | Matsutani et al. | 381/174 |
| 5,573,679 | A | | 11/1996 | Mitchell et al. | |
| 7,449,356 | B2 | | 11/2008 | Weigold | |
| 8,623,709 | B1 | * | 1/2014 | Minervini | 438/125 |
| 8,624,385 | B1 | * | 1/2014 | Minervini | 257/704 |
| 8,704,360 | B1 | * | 4/2014 | Minervini | 257/704 |
| 8,765,530 | B1 | * | 7/2014 | Minervini | 438/125 |
| 2013/0100779 | A1 | * | 4/2013 | Lee et al. | 367/188 |

FOREIGN PATENT DOCUMENTS

| KR | 10-2009-0041041 A | 4/2009 | |
| KR | 1020090041041 A | 4/2009 | |
| KR | 10-2009-0054885 A | 6/2009 | |
| KR | 1020090054885 A | 6/2009 | |
| KR | 20130044487 A * | 5/2013 | ............ H04R 31/00 |

OTHER PUBLICATIONS

Alfons Dehe, "Silicon microphone development and application", Sensors and Actuators, 2007, pp. 283-287, A 133, Elsevier.

* cited by examiner

*Primary Examiner* — Daniel Pihulic

(57) ABSTRACT

A method for fabricating an acoustic sensor according to an exemplary embodiment of the present disclosure includes: forming an acoustic sensor unit by forming a lower electrode on an upper portion of a substrate, forming etching holes on the lower electrode, forming a sacrifice layer on an upper portion of the lower electrode, and coupling a diaphragm to an upper portion of the sacrifice layer; coupling a lower portion of the substrate of the acoustic sensor unit to a printed circuit board on which a sound pressure input hole is formed so as to expose the lower portion of the substrate of the acoustic sensor unit to the outside through the sound pressure input hole; attaching a cover covering the acoustic sensor unit on the printed circuit board; etching the substrate of the acoustic sensor unit to form an acoustic chamber; and removing the sacrifice layer.

12 Claims, 20 Drawing Sheets

ACOUSTIC SENSOR AND FABRICATION METHOD THEREOF

CROSS-REFERENCE TO RELATED APPLICATIONS

This application is based on and claims priority from Korean Patent Application No. 10-2011-0108577, filed on Oct. 24, 2011, with the Korean Intellectual Property Office, the disclosure of which is incorporated herein in its entirety by reference.

TECHNICAL FIELD

The present disclosure relates to a condenser type acoustic sensor using a micro electro mechanical systems (MEMS) technology and a fabrication method thereof.

BACKGROUND

An acoustic sensor (or microphone) is an apparatus that converts voice into an electrical signal. Recently, as the development of small wired and wireless equipments has been accelerated, a size of the acoustic sensor has become smaller and smaller. Therefore, an acoustic sensor using an MEMS technology has been developed recently.

The acoustic sensor is largely classified into a piezo-type and a condenser-type. The piezo-type uses a piezo effect that generates a potential difference across a piezo substance when a physical pressure is applied to the piezo substance and is a type that converts a pressure of a voice signal into an electrical signal. The piezo-type may have many limitations in applications due to non-uniform characteristics of a low-band and voice-band frequency. The condenser-type uses a principle of a condenser in which two electrodes face each other, wherein one electrode of an acoustic sensor is fixed and the other electrode thereof serves as a diaphragm. This is a type in which a capacitance between the electrodes is changed when the diaphragm is vibrated according to the pressure of the voice signal and thus, the accumulated charges are changed, thereby making current flow. The condenser type has excellent stability and frequency characteristics. Due to the frequency characteristics, the condenser type acoustic sensor has been mainly used.

SUMMARY

The present disclosure has been made in an effort to provide an acoustic sensor with a more stable structure by inserting a support wall under a lower electrode used as a fixed electrode while suppressing a damage of a diaphragm easily occurring during a packaging process including sensor dicing and high-temperature bonding processes at the time of fabricating an existing acoustic sensor and a fabrication method thereof.

An exemplary embodiment of the present disclosure provides a method for fabricating an acoustic sensor, including: forming an acoustic sensor unit by forming a lower electrode on an upper portion of a substrate, forming etching holes on the lower electrode, forming a sacrifice layer on an upper portion of the lower electrode on which the etching holes are formed, and coupling a diaphragm to an upper portion of the sacrifice layer; coupling a lower portion of the substrate of the acoustic sensor unit to a printed circuit board on which a sound pressure input hole is formed so as to expose the lower portion of the substrate of the acoustic sensor unit to the outside through the sound pressure input hole; attaching a cover covering the acoustic sensor unit on the printed circuit board; etching the substrate of the acoustic sensor unit to form an acoustic chamber; and removing the sacrifice layer.

The forming of the acoustic sensor unit may include: forming first, second, and third grooves on the substrate; forming a low electrode support wall defined layer in the first groove, forming acoustic chamber defined layers in the second grooves, and acoustic sensor unit defined layers in the third grooves; forming a substrate insulating layer on the upper portion of the substrate; forming the lower electrode and a lower electrode insulating layer on an upper portion of a substrate insulating layer; forming the etching holes on the lower electrode; forming the sacrifice layer on the upper portion of the lower electrode on which the etching holes are formed; forming the diaphragm on the upper portion of the sacrifice layer and diaphragm supports on an upper portion of the lower electrode insulating layer; and etching a lower surface of the substrate.

The removing of the sacrificing layer may include removing the sacrifice layer by injecting etching gas through the sound pressure input hole, the acoustic chamber, and the etching holes.

Another exemplary embodiment of the present disclosure provides an acoustic sensor, including: a printed circuit board on which a sound pressure input hole for receiving an external sound pressure is formed; an acoustic sensor unit configured to be coupled on the printed circuit board so as to be exposed through the sound pressure input hole and include a diaphragm vibrated by the external sound pressure, a lower electrode used as a relative electrode of the diaphragm, and a lower electrode support wall supporting the lower electrode; and a cover configured to be attached on the printed circuit board so as to cover the acoustic sensor unit, wherein an acoustic chamber is formed between the cover and the diaphragm of the acoustic sensor unit.

The acoustic sensor unit may include: a lower electrode support wall defined layer configured to enclose an outer wall of the lower electrode support wall; an acoustic chamber defined layer configured to be formed at an outside of the lower electrode support wall defined layer; and an acoustic sensor unit defined layer configured to be formed at the outside of the acoustic chamber defined layer.

According to the exemplary embodiments of the present disclosure, the acoustic sensor has a structure that can perform the sacrifice removing and acoustic chamber forming processing after performing the packaging process at the time of fabricating the acoustic sensor, thereby easily removing the dicing fragments that are generated during the dicing process of the related art to damage the diaphragm, like solid state electronic devices.

The acoustic sensor has a structure of fixing the diaphragm on the sacrifice layer to the substrate, thereby radically removing the thermal deformation possibility of the diaphragm occurring during the high-temperature packaging.

The acoustic sensor has the stable electrode support structure by inserting the lower electrode support wall structure into the substrate so as to use the lower electrode as the fixed electrode.

Only the top of the substrate is subjected to the patterning process to greatly reduce the minimum thickness requirements of the substrate that is required for the double-sided processing of the acoustic sensor of the related art, thereby processing the substrate at a very thin thickness.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIGS. 1A to 10A are plan views for describing a method for fabricating an acoustic sensor according to an exemplary embodiment of the present disclosure.

FIGS. 1B to 7B each are cross-sectional views taken along the line 1-I' of FIGS. 1A to 7A.

FIGS. 1C to 7C each are cross-sectional views taken along the line I1-II' of FIGS. 1A to 7A.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

FIGS. 1A to 10C are diagrams for describing a method for fabricating an acoustic sensor according to an exemplary embodiment of the present disclosure. In detail, FIGS. 1A to 10A are plan views for describing a method for fabricating an acoustic sensor according to an exemplary embodiment of the present disclosure, FIGS. 1B to 7B each are cross-sectional views taken along the line 1-I' of FIGS. 1A to 7A, FIGS. 1C to 7C each are cross-sectional views taken along the line I1-II' of FIGS. 1A to 7A, FIG. 8B is a cross-sectional view taken along the line III-III' of FIG. 8A, FIG. 8C is a cross-sectional view taken along the line IV-IV' of FIG. 8A, FIGS. 9B and 10B each are cross-sectional views taken along the line V-V' of FIGS. 9A and 10A, FIGS. 9C and 10C each are cross-sectional views taken along the line VI-VI' of FIGS. 9A and 10A, and FIGS. 2D and 9D each are perspective views of FIGS. 2A and 9A.

Figure 1A:
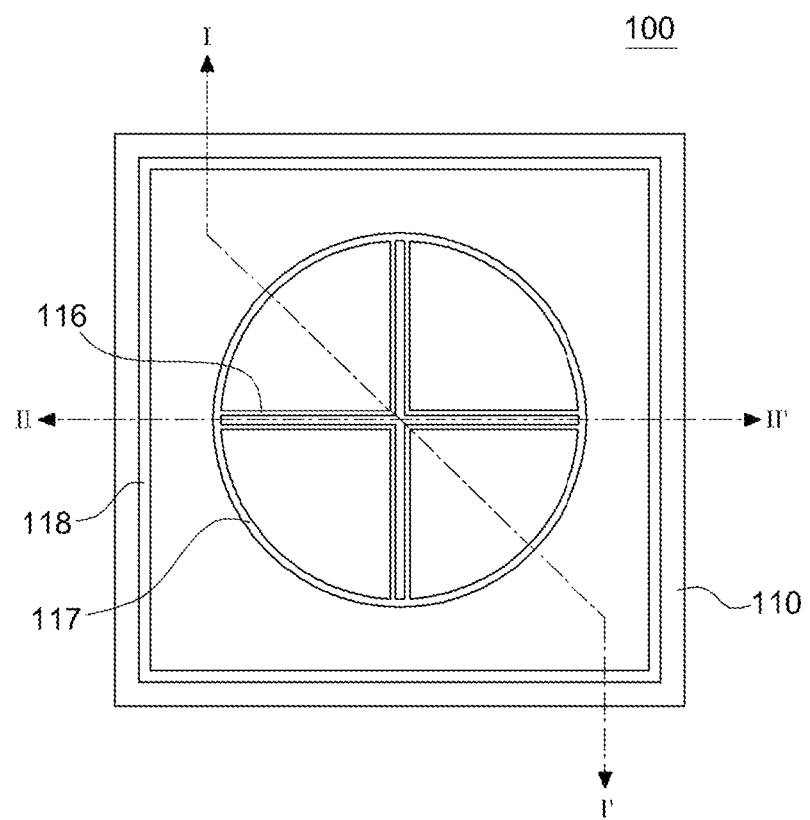
Figure 1B:
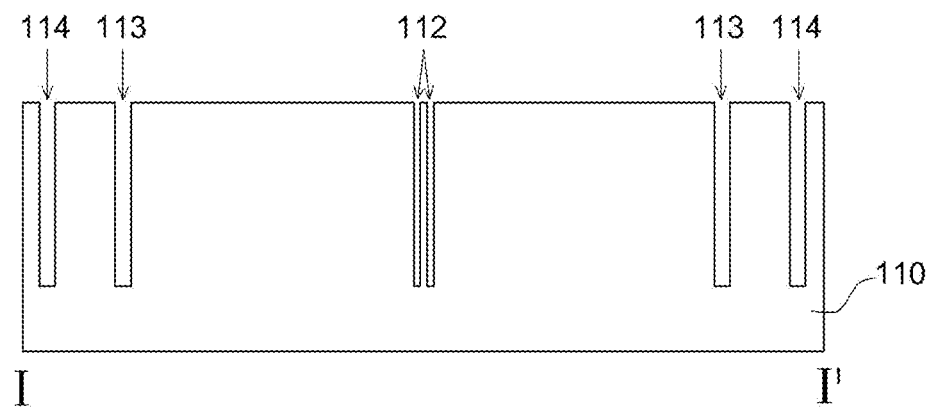
Figure 1C:
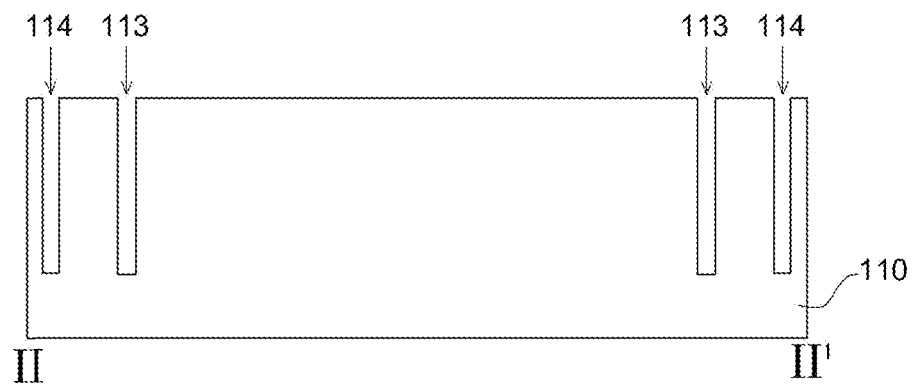
Figure 2A:
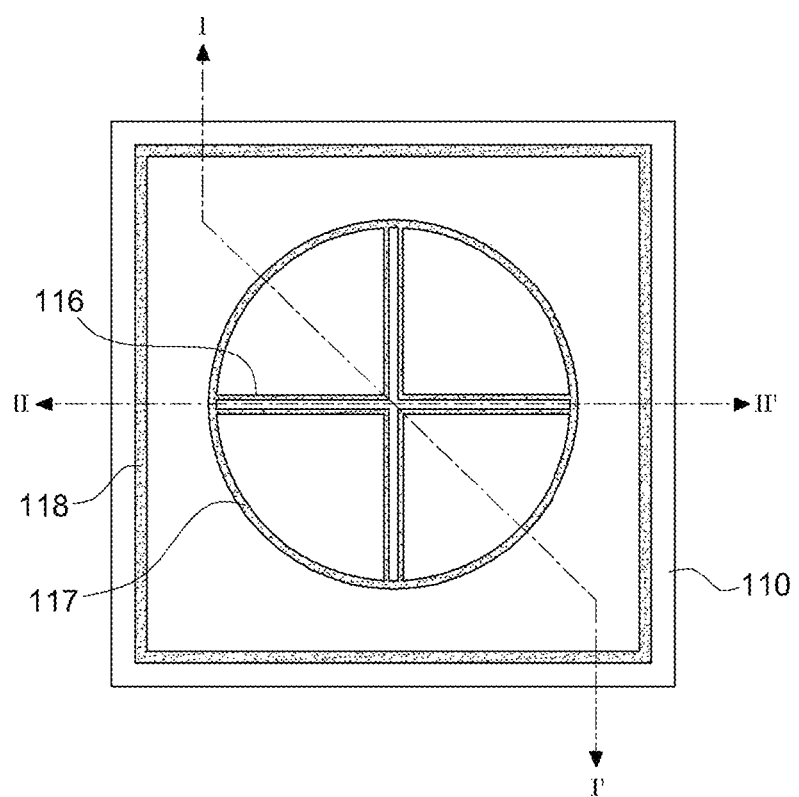
Figure 2B:
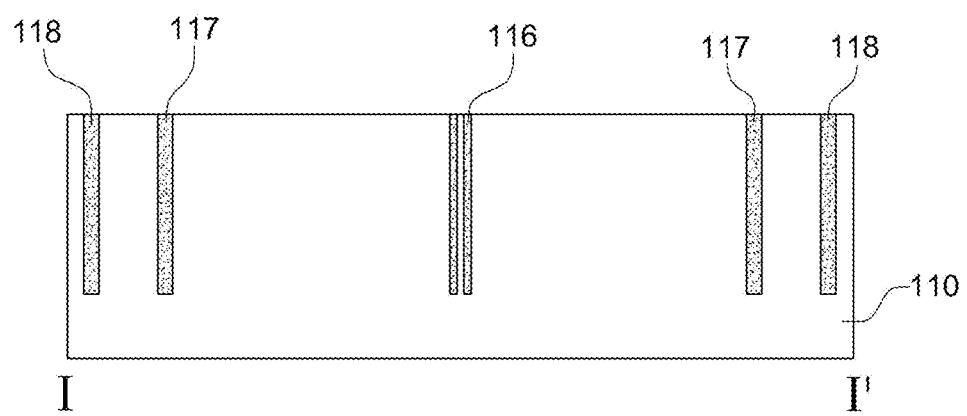
Figure 2C:
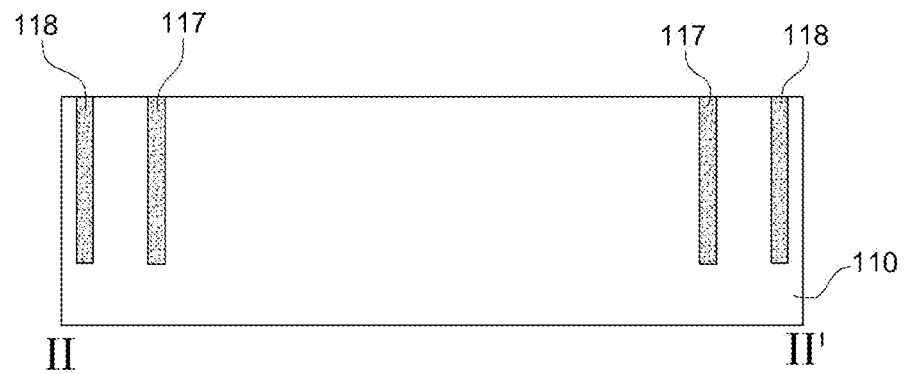
Figure 2D:
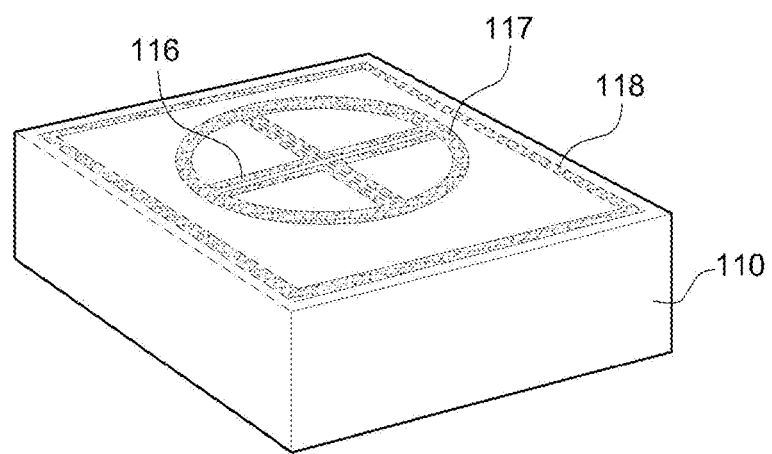
FIGS. 2D and 9D each are perspective views of FIGS. 2A and 9A.

Referring to FIGS. 1A to 1C, a substrate 110 may be provided with a first groove 112, second grooves 113 enclosing the first groove 112 while being spaced apart from the first groove 112 at a predetermined distance, and third grooves 114 enclosing the second grooves 113.

The substrate 110 may be an Si substrate or a compound semiconductor substrate. For example, a III group-V group compound semiconductor substrate may be formed of GaAs or InP. The substrate 110 may be a rigid or flexible substrate.

The first, second, and third grooves 112, 113, and 114 may be formed using a dry etching method. The first, second, third grooves 112, 133, and 114 may each be formed in a closed loop shape having a quadrangular frame and may be formed at a width of 1 to several μm and a depth of 10 to several hundreds of μm.

Referring to FIGS. 2A to 2D, a lower electrode support wall defined layer 116 may be formed in the first groove 112, acoustic chamber defined layers 117 may be formed in the second grooves 113, and acoustic sensor unit defined layers 118 may be formed in the third grooves 114.

The lower electrode support wall defined layer 116, the acoustic chamber defined layers 117, and the acoustic sensor unit defined layers 118 may be formed of an oxide film. The lower electrode support wall defined layers 116, the acoustic chamber defined layers 117, and the acoustic sensor unit defined layers 118 may be formed by forming an insulating layer (not shown) on the substrate 110 including the first, second, and third grooves 112, 113, and 114 and then, planarizing the insulating layer.

The lower electrode support wall defined layer 116 is to implement a lower electrode support wall 146 (see FIG. 9B) having a predetermined shape by preventing etching gas from introducing into an inner side of the lower electrode support wall defined layer 116 when an acoustic chamber 144 (see FIG. 9B) is formed on the substrate 110 during the subsequent process.

The acoustic chamber defined layers 117 is to fabricate the acoustic chamber 144 (see FIG. 9B) having a predetermined shape by preventing the etching gas from introducing into outer sides of the acoustic chamber defined layers 117 at the time of forming the acoustic chamber 144 (see FIG. 9B) during the subsequent process.

The acoustic chamber defined layers 118 is to fabricate an acoustic sensor unit 100 (see FIG. 9B) having a predetermined shape by preventing the etching gas from introducing into the outer sides of the acoustic chamber defined layers 118 at the time of forming the acoustic chamber 144 (see FIG. 9B) during the subsequent process.

The planarization process may be performed using a front etching process, an etchback process, a chemical mechanical polishing (CMP) process, and the like.

Figure 3A:
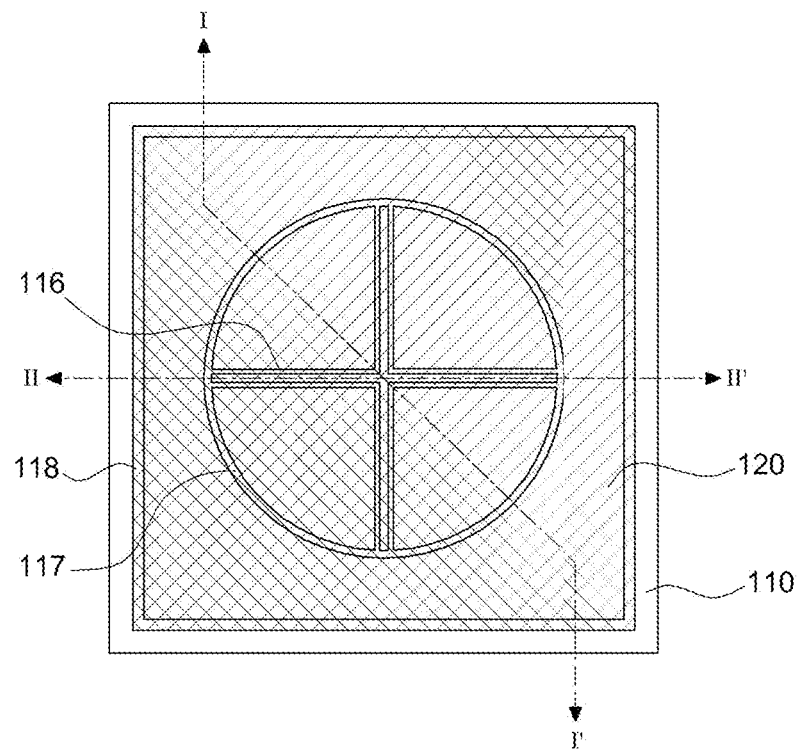
Figure 3B:
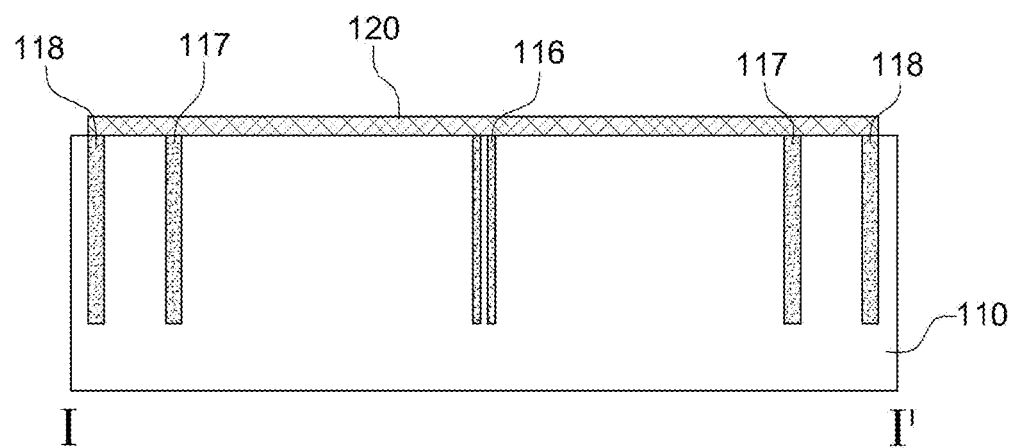
Figure 3C:
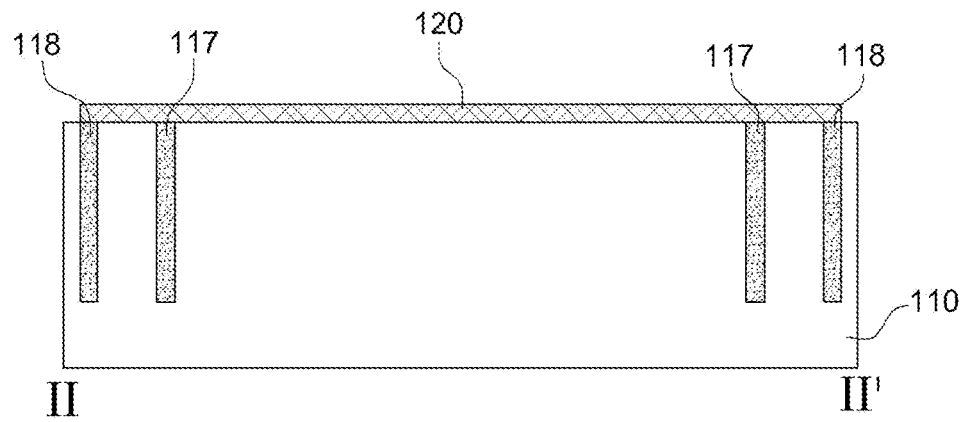

Referring to FIGS. 3A to 3C, the substrate insulating layer 120 is formed on the lower electrode support wall defined layer 116, the acoustic chamber defined layers 117, the acoustic sensor unit defined layers 118, and the exposed substrate 110.

Figure 4A:
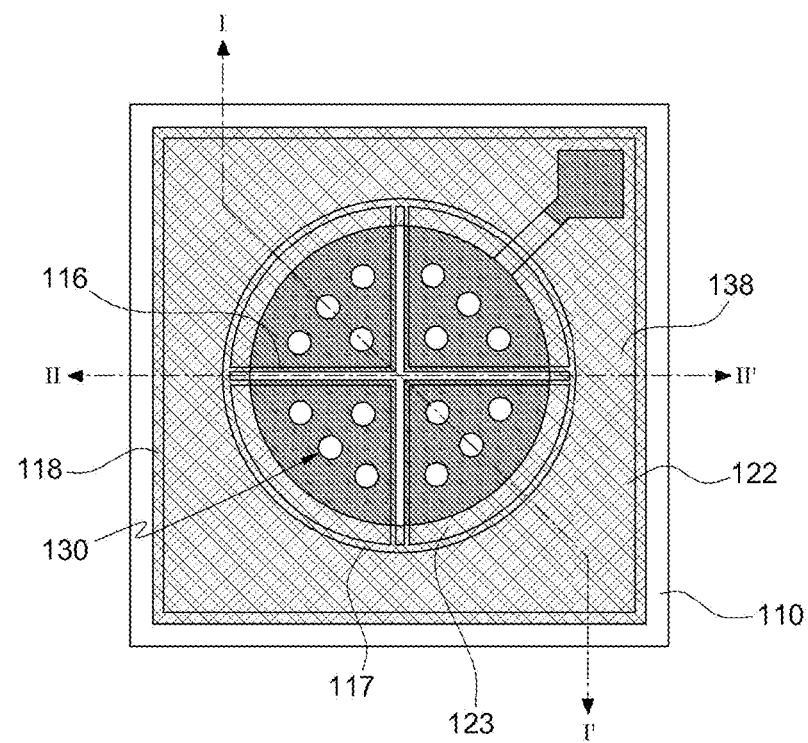
Figure 4B:
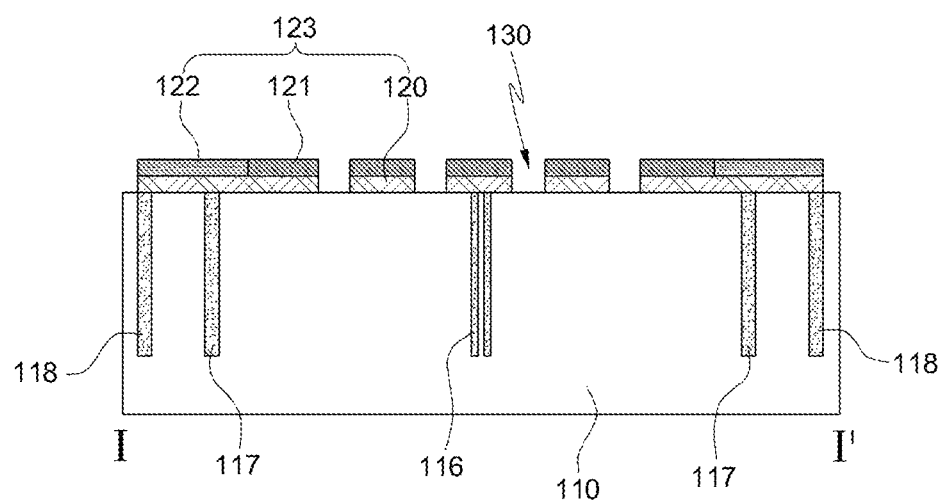
Figure 4C:
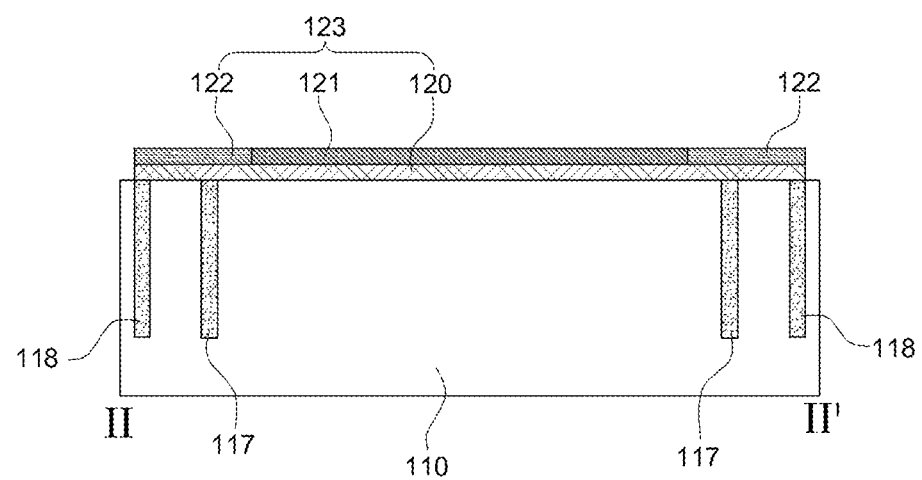

Referring to FIGS. 4A to 4C, a lower electrode 121 and lower electrode insulating layers 122 are sequentially formed on the upper portion of the substrate insulating layer 120.

The substrate insulating layer 120 is to insulate the lower electrode 121 from the substrate 110 and can be omitted. The lower electrode insulating layers 122 are to insulate a diaphragm 136 (see FIG. 6B) to be formed later from the lower electrode 121 and can be omitted.

The substrate insulating layer 120 and the lower electrode insulating layers 122 may be formed of an oxide film or an organic film. In this configuration, the substrate insulating layer 120, the lower electrode 121, and the lower electrode insulating layers 122 may be provided as a fixed electrode 123 of the acoustic sensor unit 100 (see FIG. 8A).

An inside of the fixed electrode 123 may be provided with a plurality of holes 130 so as to form the acoustic chamber 144 (see FIG. 8B) during the subsequent process. The plurality of holes 130 may be defined as acoustic chamber etching holes.

The acoustic chamber etching holes 130 may be formed at the outside of the lower electrode support wall defined layer 116.

Figure 5A:
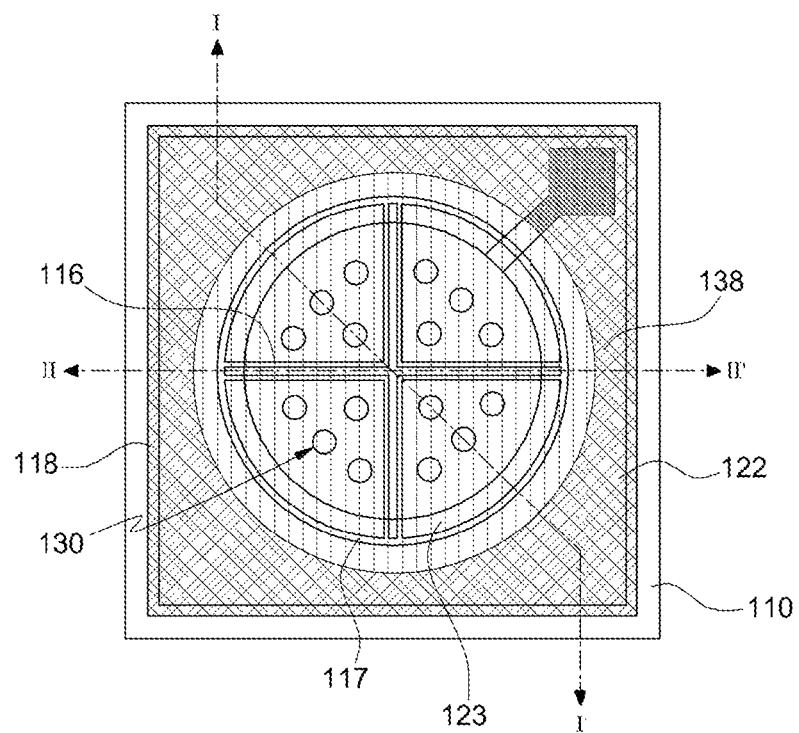
Figure 5B:
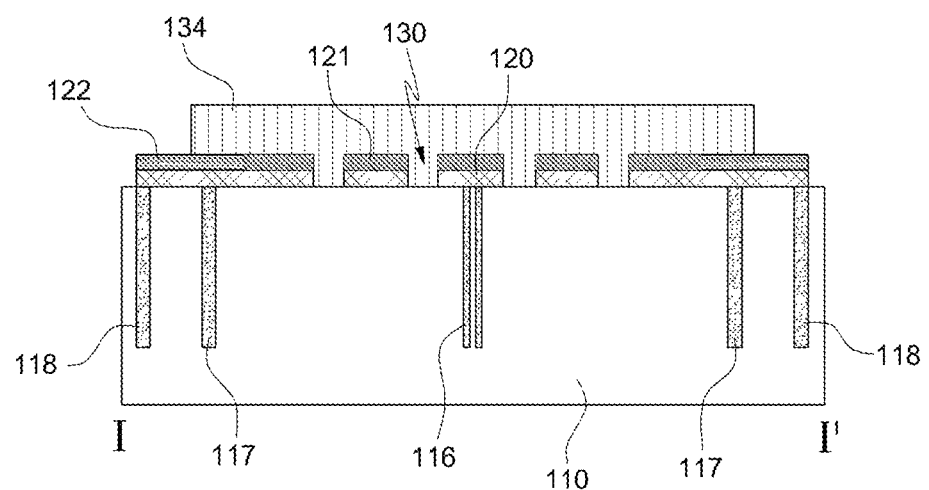
Figure 5C:
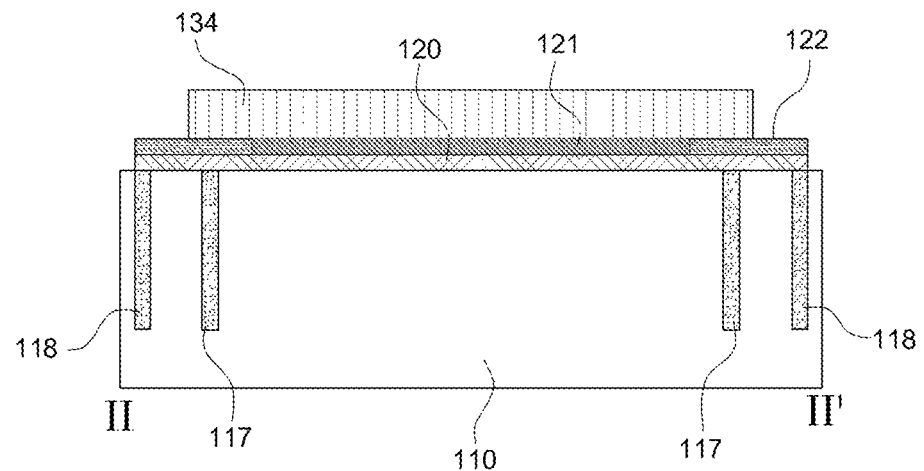

Referring to FIGS. 5A to 5C, a sacrifice layer 134 is formed on the lower electrode insulating layers 122. The sacrifice layer 134 is to float the diaphragm 136 (see FIG. 6C) formed during the subsequent process.

The sacrifice layer 134 may be formed of materials having etching selectivity different from the substrate insulating layer 120 and the lower electrode insulating layers 122. The sacrifice layer 134 may be formed of, for example, the oxide film or the organic film and may be formed at a thickness of several μm.

Figure 6A:
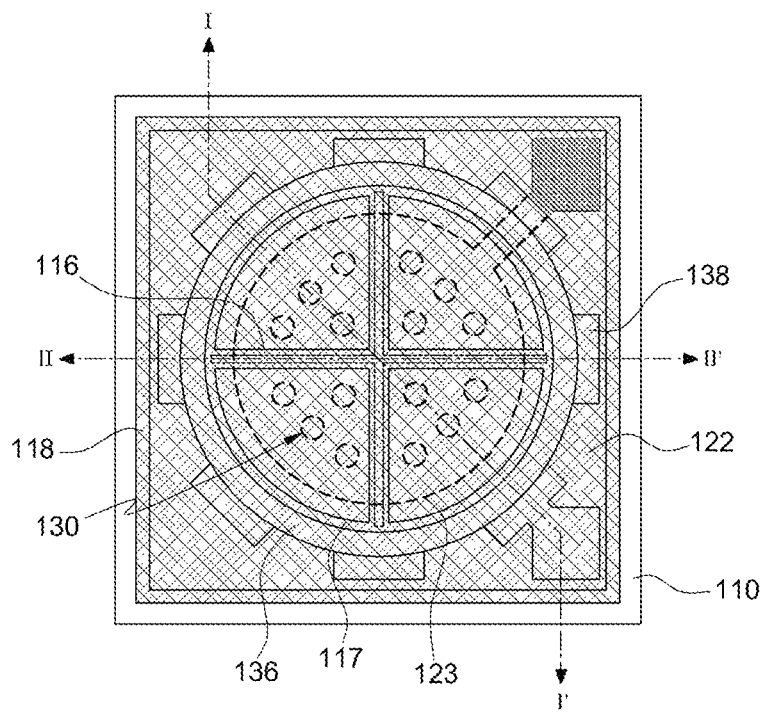
Figure 6B:
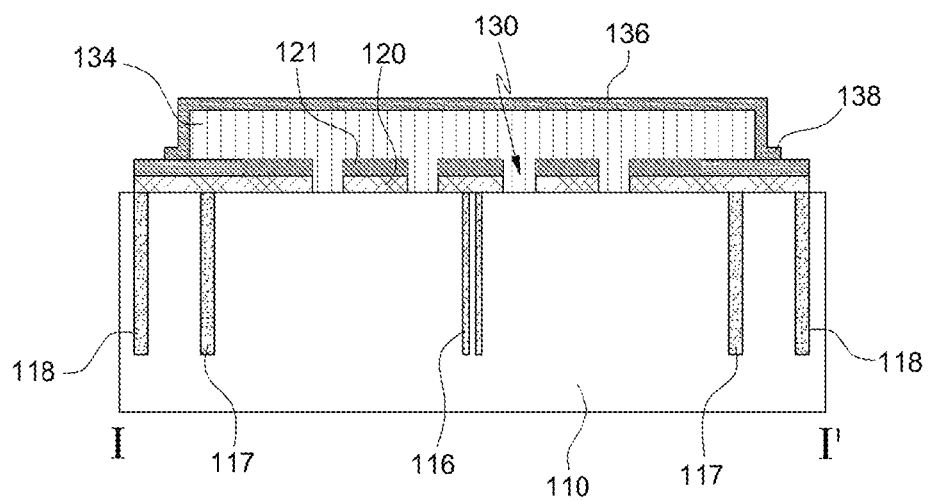
Figure 6C:
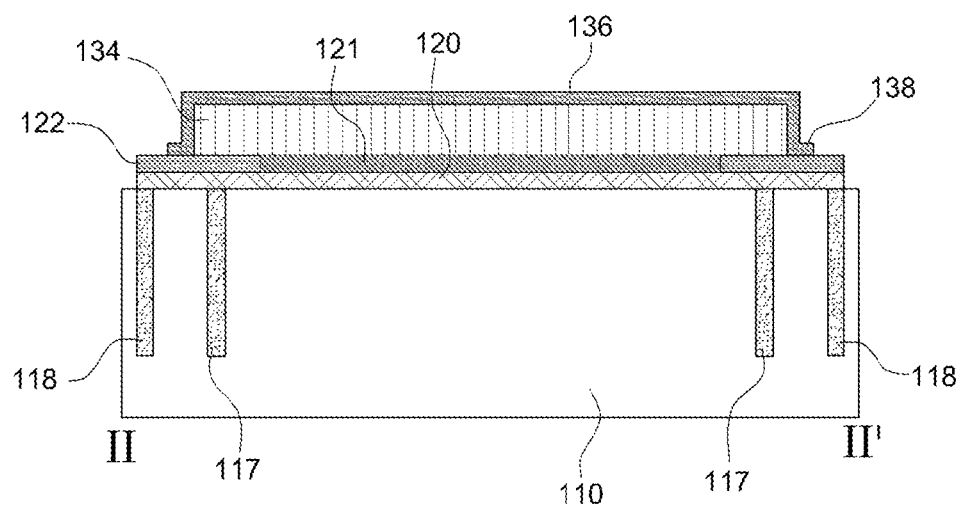

Referring to FIGS. 6A to 6C, the diaphragm 136 is formed on the sacrifice layer 134.

The diaphragm 136 may have a thickness of several μm.

The diaphragm 136 may be formed to have a single layer structure of a conductive layer or a stacked structure of the insulating layer and the conductive layer. In this configuration, the conductive layer is used as a relative electrode and may be metal. The insulating layer may be formed of the oxide film or the organic film having etching selectivity different from the sacrifice layer 134.

When forming the diaphragm 136, a plurality of diaphragm supports 138 may be formed on the lower electrode insulating layers 122 of both sides of the diaphragm 136. The diaphragm supports 138 may be integrally formed by extending from at least four edges of the diaphragm 136. The plurality of diaphragm supports 130 may be arranged symmetrically.

The diaphragm 136 and the diaphragm supports 138 may be formed by forming a conductive layer or a stacked layer of the insulating layer and the conductive layer on the sacrifice layer 134 and the exposed lower electrode insulating layers 122 and then patterning the conductive layer or the stacked layer using a photolithography process.

Figure 7A:
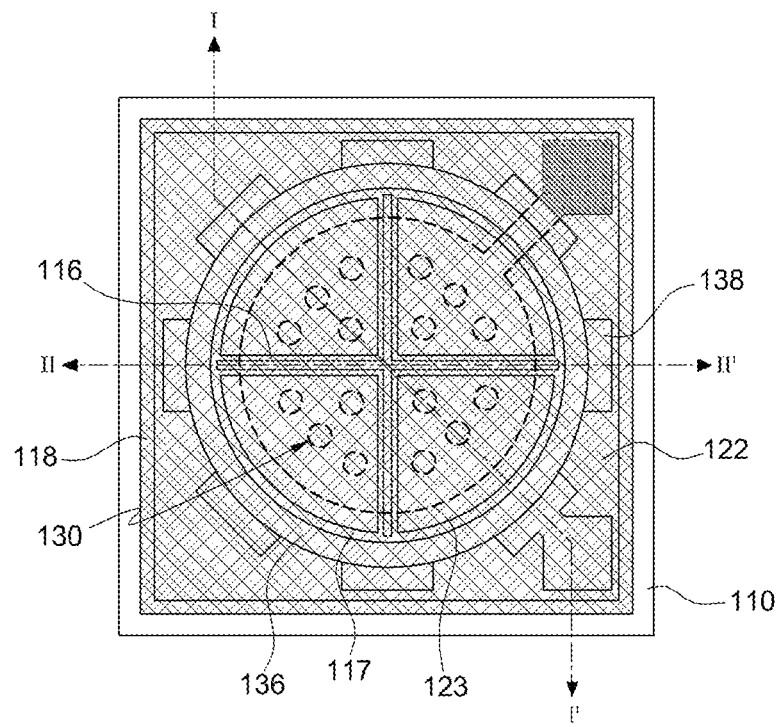
Figure 7B:
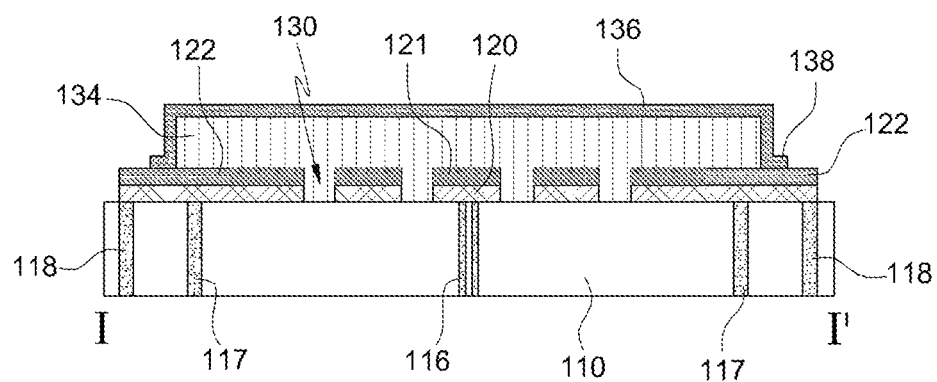
Figure 7C:
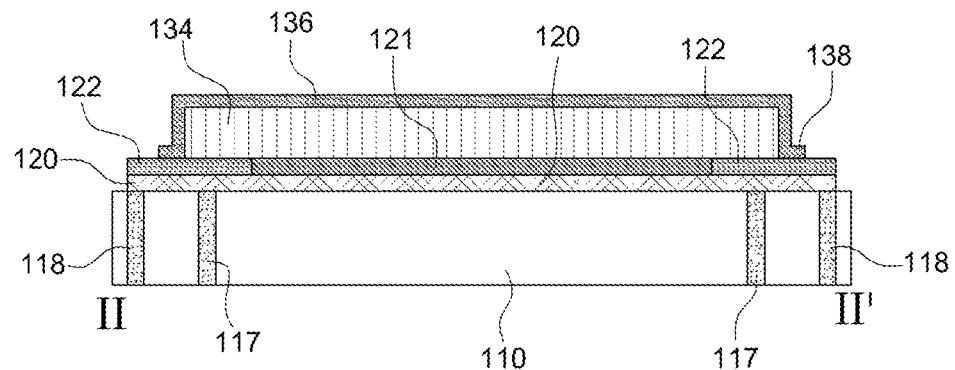

Referring to FIGS. 7A to 7C, the lower portion of the substrate 110 of the acoustic sensor unit 100 is etched so as to expose the lower electrode support wall defined layer 116.

Figure 8A:
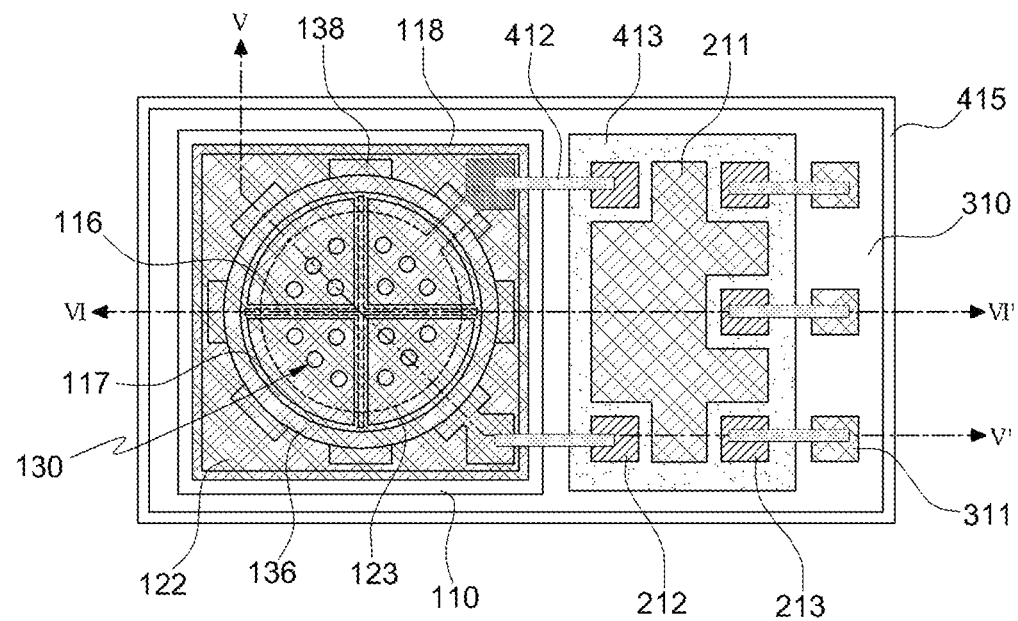
Figure 8B:
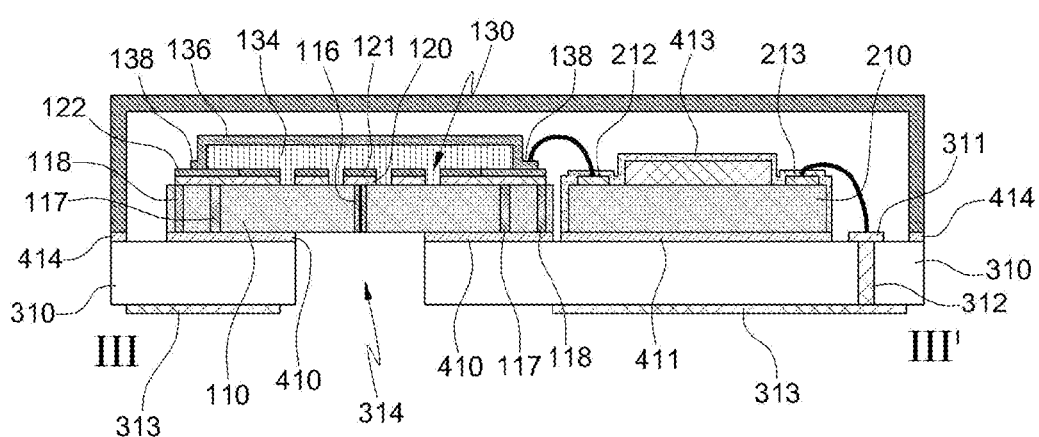
FIG. 8B is a cross-sectional view taken along the line III-III' of FIG. 8A.
Figure 8C:
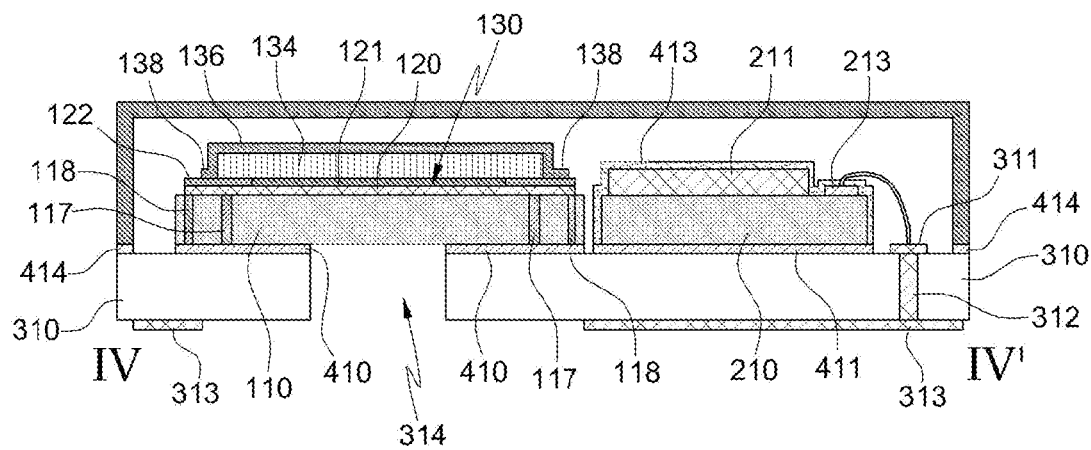
FIG. 8C is a cross-sectional view taken along the line IV-IV' of FIG. 8A.
Figure 9A:
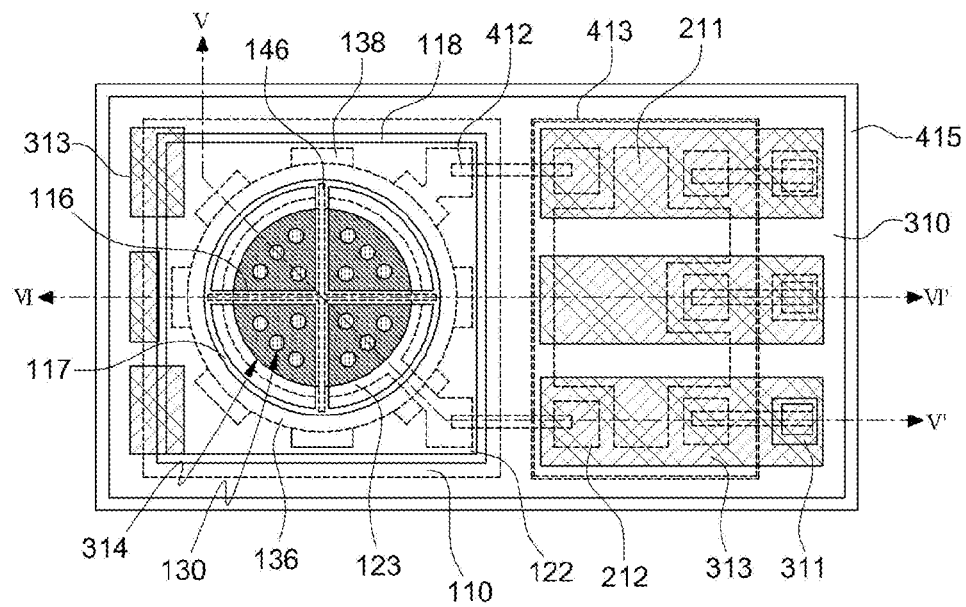
Figure 9B:
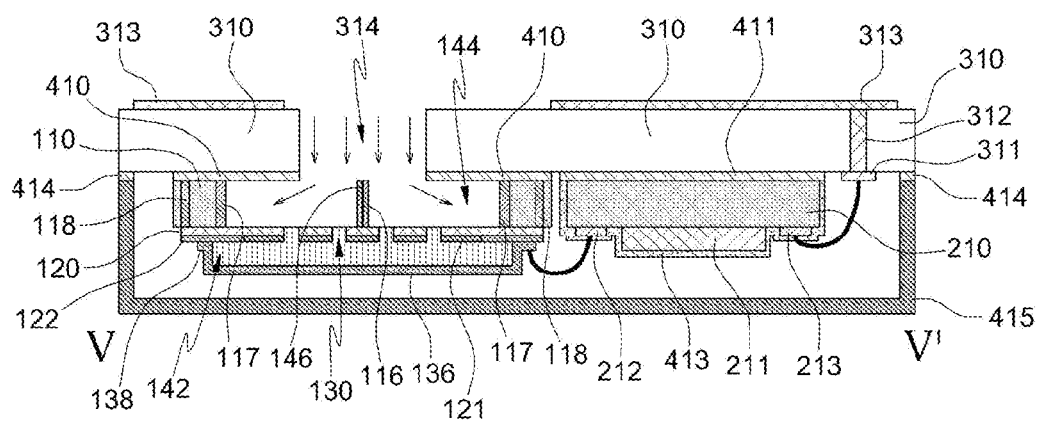
FIGS. 9B and 10B each are cross-sectional views taken along the line V-V' of FIGS. 9A and 10A.
Figure 9C:
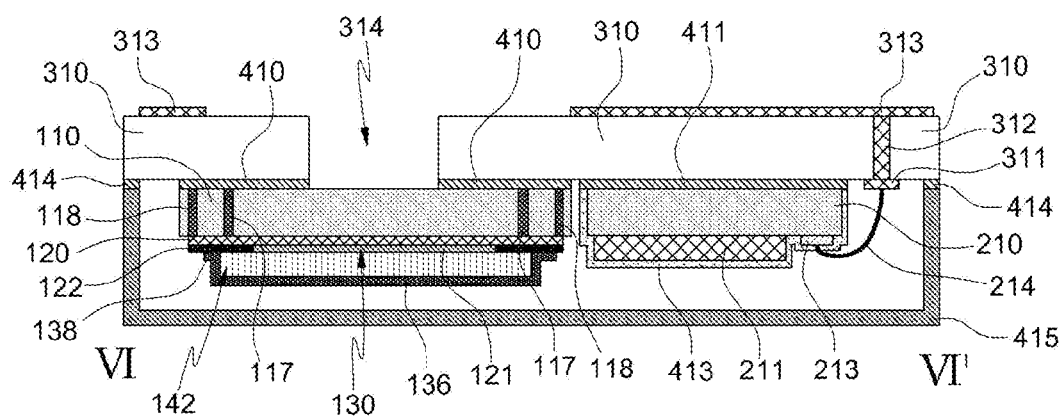
FIGS. 9C and 10C each are cross-sectional views taken along the line VI-VI' of FIGS. 9A and 10A.
Figure 9D:
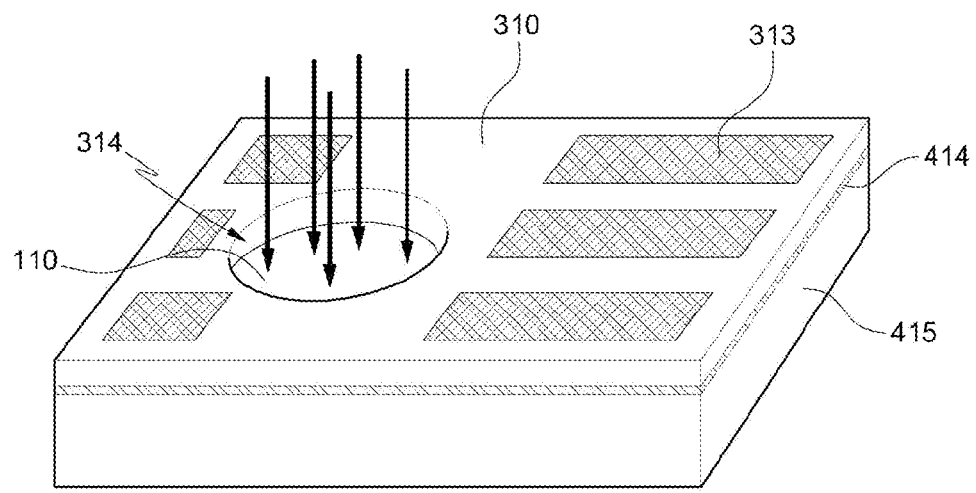

Referring to FIGS. 8A to 8C, the acoustic sensor unit 100 is fixed to a printed circuit board 310 of a printed circuit part 300 together with a signal processing unit by using an acoustic sensor unit solder 410 and a signal processing unit solder 411.

The acoustic sensor unit 100 fixed on the printed circuit board 310 is electrically connected with the signal processing unit through wires 412 to transfer a final signal to signal pads 313 of the printed circuit board.

The signal processing unit fixed on the printed circuit board 310 is connected by the wires 412 and then, protected with a signal processing unit protective layer 413 so as to protect a surface thereof.

The acoustic sensor unit 100 and the signal processing unit attached on the printed circuit board 310 are protected from external environments using a cover 415.

Referring to FIGS. 9A to 9D, the acoustic chamber 144 is formed in a lower area of the acoustic sensor unit 100 attached to the lower portion of the printed circuit board 310 through a sound pressure input hole 314.

The acoustic chamber 144 may be formed by etching the substrate 110 using the dry etching method.

When the substrate 110 is the Si substrate, as the etching process the dry etching process may be performed. The dry etching process may be performed using, for example, XeF2 gas that can implement isotropic etching.

That is, the dry etching process may be performed by injecting etching gas suitable for materials for forming the substrate 110 Therefore, the etching gas introduced through the sound pressure input hole 314 is introduced into the substrate 110 and thus, the substrate 110 may be etched. In this case, an arrow indicates a progress direction of the etching gas.

In this case, the acoustic chamber defined layers 117 and the lower electrode support wall defined layer 116 act as an etch stopping layer during the etching process, such that the acoustic chamber 144 may be formed in an area between the lower electrode support wall defined layer 116 and the acoustic chamber defined layers 117. Due to the acoustic chamber defined layers 117, the size of the acoustic chamber 144 may be defined.

Figure 10A:
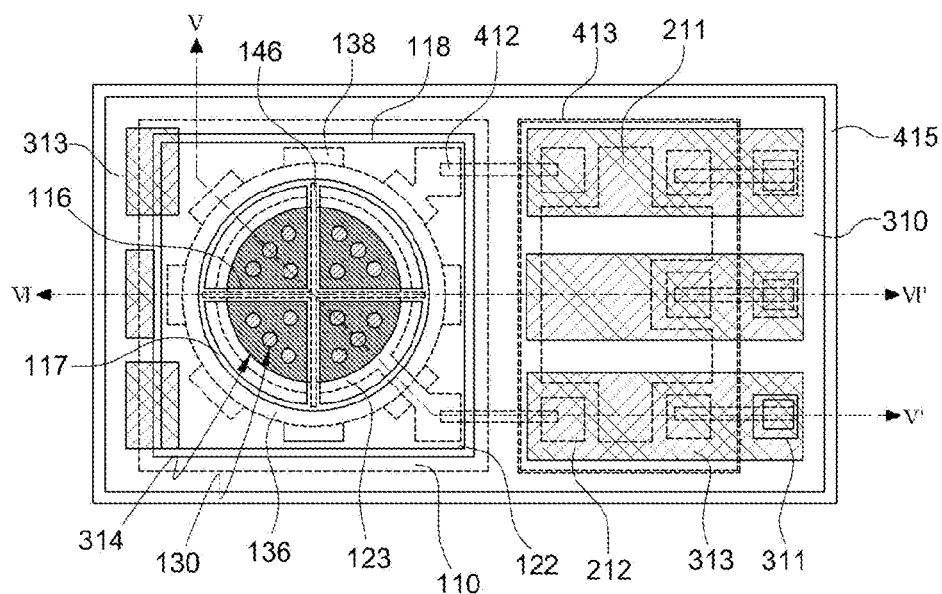
Figure 10B:
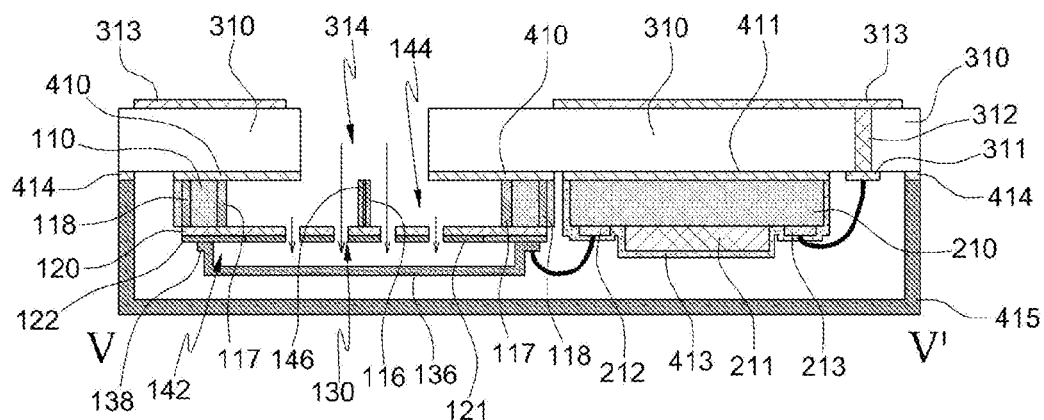
Figure 10C:
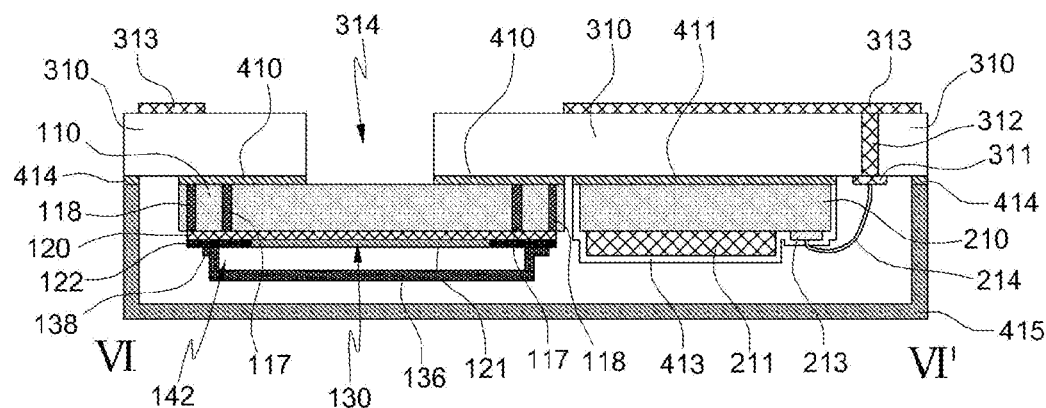

Referring to FIGS. 10A to 10C, the sacrifice layer 134 of an acoustic sensor 500 is formed using the acoustic chamber etching holes 130 disposed under the acoustic chamber 144 formed through the sound pressure input hole 314 in the printed circuit board 310.

The sacrifice layer 134 is removed by etching. The sacrifice layer 134 may be removed by etching using the dry etching method.

The etching process may be performed using, for example, O2 gas when the sacrifice layer 134 is the organic film.

That is, the foregoing etching process may be performed by injecting the etching gas suitable for materials for forming the sacrifice layer 134 onto the sacrifice layer 134. In this case, as the etching gas is introduced into the sacrifice layer 134 through the acoustic chamber etching holes 130, the sacrifice layer 134 between the lower electrode insulating layers 122 and the diaphragm is removed and then, the sacrifice layer 134 in the acoustic chamber etching holes 130 may be selectively etched to be removed. In this case, an arrow indicates an etching progress direction of the etching gas.

Therefore, as an empty space between the lower electrode insulating layers 122 disposed on the diaphragm 136, a diaphragm gap 142 used as a vibration space of the diaphragm 136 is formed. As the result, the fixed electrode 123 and the diaphragm 136 face each other at a predetermined distance.

As such, the sacrifice layer 134 may be etched by a fine processing technology through the acoustic chamber etching holes 140 to be removed.

Therefore, the acoustic sensor 500 including the fixed electrode 123, the diaphragm 136 facing the fixed electrode 123 but spaced apart therefrom at a predetermined distance, the acoustic chamber 144, and the lower electrode support wall 146 may be completed.

According to the exemplary embodiment of the present disclosure, the acoustic sensor 500 is fabricated in one lump by processing only the upper portion of the acoustic sensor unit substrate 110 and including the package in the fabrication process, thereby controlling the thermal deformation occurring during the package process.

As the acoustic sensor 500 may be fabricated through only the upper process of the acoustic sensor unit substrate 110, the fabrication process can be more simplified, the defects occurring during the fabrication process can be minimized, and the process yield can be improved, as compared with the related art using the double-sided processing of the upper and lower portions of the substrate.

Meanwhile, although the exemplary embodiment of the present disclosure describes the acoustic sensor unit 100 including the lower electrode support wall 146 and the lower electrode support wall defined layer 116, the lower electrode support wall 146 and the lower electrode support wall defined layer 116 may be omitted according to whether the fixed electrode 123 is fixed.

Figure 11:
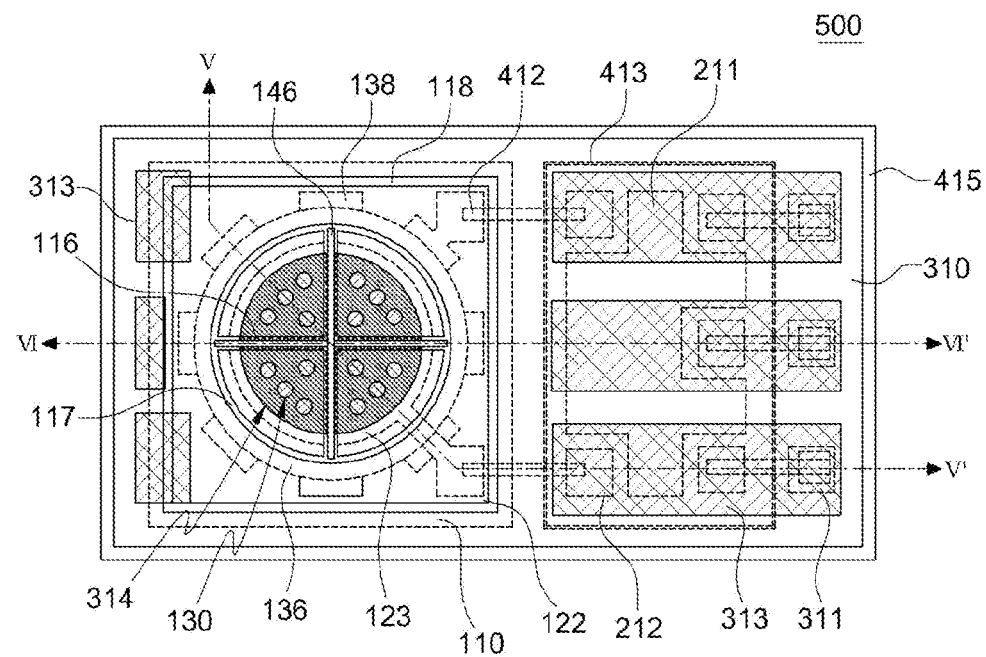
FIG. 11 is a plan view of an acoustic sensor according to an exemplary embodiment of the present disclosure.
Figure 12:
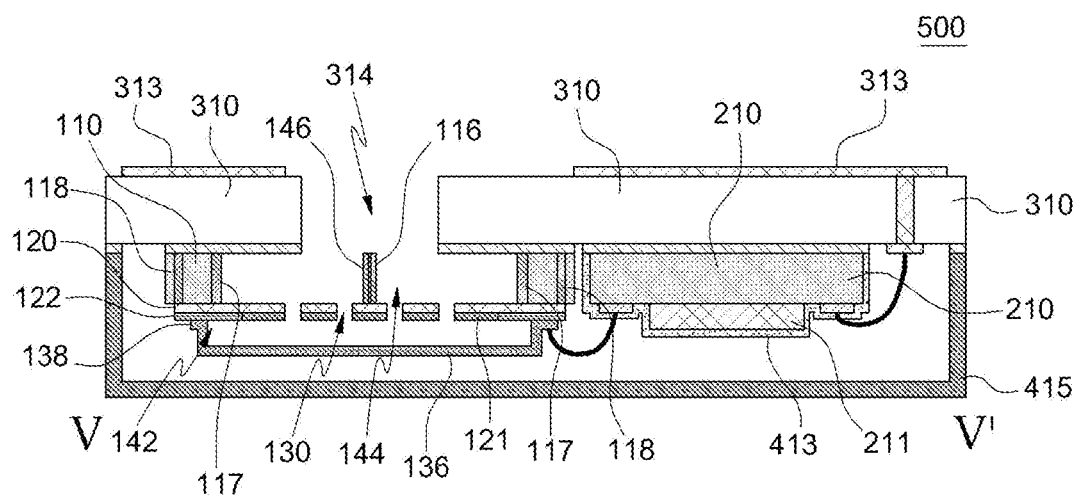
FIG. 12 is a cross-sectional view taken along the line V-V' of FIG. 11.

FIG. 11 is a plan view of the acoustic sensor 500 according to the exemplary embodiment of the present disclosure fabricated through the foregoing fabrication process. FIG. 12 is a cross-sectional view taken along the line V-V' of FIG. 11 and FIG. 13 is a cross-sectional view taken along the line VI-VI' of FIG. 11.

Figure 13:
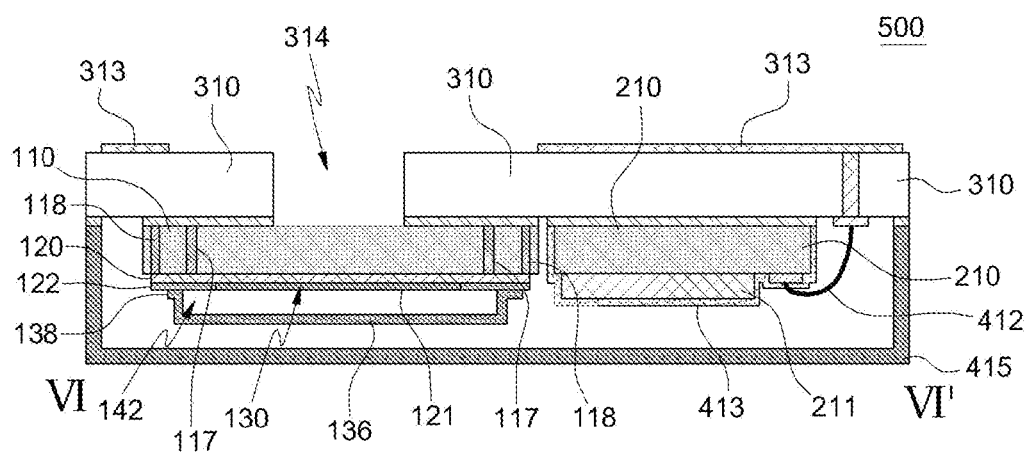
FIG. 13 is a cross-sectional view taken along the line VI-VI' of FIG. 11.

Referring to FIGS. 11 to 13, the acoustic sensor 500 according to the exemplary embodiment of the present disclosure includes an acoustic sensor unit, a signal processing unit, and a printed circuit unit.

The acoustic sensor unit may include the substrate 110, the fixed electrode 123, the diaphragm 136, the plurality of diaphragm supports 138, and the acoustic chamber 144.

The substrate 110 may be an Si substrate or a compound semiconductor substrate. For example, a III group-V group compound semiconductor substrate may be formed of GaAs or InP. The substrate 110 may be a rigid or flexible substrate.

The fixed electrode 123 may include the substrate insulating layer 120, the lower electrode 121, and the lower electrode insulating layer 122 that are sequentially formed on the substrate 110. The substrate insulating layer 120 and the lower electrode insulating layers 122 may be formed of an oxide film or an organic film. The substrate insulating layer 120 and a lower electrode insulating layer 122 can be omitted.

The substrate 110 may be provided with the first groove 112, the second grooves 113, and the third grooves 114. The first groove 112 is formed to fabricate the lower electrode support wall defined layers 117, the second grooves 113 are formed to fabricate the acoustic chamber defined layer 118, and the third grooves 114 are formed to fabricate the acoustic sensor unit defined layer 118.

The fixed electrode 123 includes the acoustic chamber etching holes 130.

The diaphragm 136 may be formed to face the fixed electrode 123, having the sacrifice layer 134 therebetween. The diaphragm 136 is used as the relative electrode of the fixed electrode 123 and the fixed electrode 123 and the diaphragm 136 form a pair of electrodes.

The diaphragm 136 may be formed to have the single layer structure of the conductive layer or the stacked structure of the insulating layer and the conductive layer. The conductive layer may be formed of, for example, metals.

The diaphragm 136 may have a thickness of several μm and may be fabricated in a circle. The sacrifice layer 134 may be defined as the diaphragm gap 142.

The plurality of diaphragm supports 138 may be formed at the sides of the diaphragm 136 on the lower electrode insulating layer 122 so as to react to the diaphragm 136 at the time of the vibration due to the sound pressure.

The plurality of diaphragm supports 138 may be integrally provided by extending from one edge of the diaphragm 136 and may be provided in at least four by being symmetrically arranged. The diaphragm support 138 may be formed of the same material as the diaphragm 136.

The acoustic chamber 144 may be provided on the substrate 110 under the fixed electrode 123. The acoustic chamber 144 is connected with the acoustic chamber etching holes 130.

The acoustic sensor unit may further include the lower electrode support wall 146 that extends from the bottom surface of the substrate 110 below the fixed electrode 128 to support the lower electrode 121. For example, the lower electrode support wall 146 may have a square pillar shape.

The lower electrode support wall 146 rigidly fixes the fixed electrode 123 configured to include the substrate insulating layer 120, the lower electrode 121, and the lower electrode insulating layer 122 to the substrate 110 to serve to linearly react only the diaphragm 136 to the external sound pressure and to allow the diaphragm to have excellent frequency characteristics.

The acoustic sensor unit may further include the lower electrode support wall defined layer 116 enclosing an outer wall of the lower electrode support wall 146. For example, the lower electrode support wall defined layer 116 may have a width of 1 to several μm and a depth of 10 to several hundreds of μm. The appearance of the lower electrode support wall 146 may be defined by an inner circumferential surface of the lower electrode support wall defined layer 116. The lower electrode support wall defined layer 116 may be formed of an oxide film.

The acoustic sensor unit may further include the acoustic chamber defined layer 117 enclosing the lower electrode support defined layer 116 in the substrate 110 The acoustic chamber defined layer 117 may be formed in a closed loop shape having a width of 1 to several μm and 10 to several hundreds of μm, The acoustic chamber defined layer 117 may be formed of an oxide film.

The acoustic sensor unit may further include the acoustic sensor unit defined layer 118 enclosing the acoustic chamber defined layers 117 in the substrate 110. The acoustic sensor unit defined layer 118 may be formed in a closed loop shape having a width of 1 to several μm and 10 to several hundreds of μm, The acoustic sensor unit defined layer 118 may be formed of an oxide film.

The sacrifice layer 134 disposed under the diaphragm 136 is removed after the package process, thereby facilitating the dicing operation of the sample. The MEMS type acoustic sensor according to the related art has problems in that fine dusts are generated due to the removal of the sacrifice layer 134 before the dicing to damage the diaphragm. In order to prevent these problems, the central portion of the substrate can be cut only by the elaborate and expensive dicing method instead of the existing dicing method. However, the method for removing the sacrifice layer 134 according to the exemplary embodiment of the present disclosure is performed after the dicing and packaging processes and therefore, provides easiness of handling as the solid state electronic devices and insensitivity to the thermal deformation occurring during the wire bonding or the packaging.

Since only the upper portion of the substrate is subjected to the patterning process, the acoustic sensor unit does not have limitations in the minimum thickness of the substrate according to the double-sided processing of the acoustic sensor according to the related art and therefore, may be processed at the very thin thickness of half or less than that of the existing acoustic sensor.

The signal processing unit may include a signal processing circuit board 210, a signal processing circuit 211, an acoustic sensor pad 212, and an output signal pad 213.

The printed circuit board may include an output signal connection pad 311, an output signal through metal 312, a signal pad 313, and a sound pressure input hole 314.

The acoustic sensor 500 may include an acoustic sensor unit solder 410, a signal processing unit solder 411, a cover solder 412, a wire 413, a signal processing unit protective layer 414, and a cover 415.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A method for fabricating an acoustic sensor, comprising:
   forming an acoustic sensor unit by forming a lower electrode on an upper portion of a substrate, forming etching holes on the lower electrode, forming a sacrifice layer on an upper portion of the lower electrode on which the etching holes are formed, and coupling a diaphragm to an upper portion of the sacrifice layer;

coupling a lower portion of the substrate of the acoustic sensor unit to a printed circuit board on which a sound pressure input hole is formed so as to expose the lower portion of the substrate of the acoustic sensor unit to an exterior environment through the sound pressure input hole;

attaching a cover covering the acoustic sensor unit on the printed circuit board;

etching the substrate of the acoustic sensor unit to form an acoustic chamber; and removing the sacrifice layer.

2. The method of claim 1, wherein forming the acoustic sensor unit further comprises:

forming first, second, and third grooves on the substrate;

forming a lower electrode support wall defined layer in the first groove;

forming acoustic chamber defined layers in the second grooves; and forming acoustic sensor unit defined layers in the third grooves;

forming a substrate insulating layer on the upper portion of the substrate;

forming the lower electrode and a lower electrode insulating layer on an upper portion of a substrate insulating layer;

forming the etching holes on the lower electrode;

forming the sacrifice layer on the upper portion of the lower electrode on which the etching holes are formed;

forming the diaphragm on the upper portion of the sacrifice layer; and forming diaphragm supports on an upper portion of the lower electrode insulating layer; and etching a lower surface of the substrate.

3. The method of claim 2, wherein forming the acoustic chamber includes selectively removing an exposed portion in the acoustic chamber defined layer of the substrate by introducing etching gas through the sound pressure input hole.

4. The method of claim 1, further comprising:

prior to the removing of the sacrifice layer, removing fine dusts by cleaning the acoustic sensor unit.

5. The method of claim 1, wherein the removing of the sacrificing layer includes removing the sacrifice layer by injecting etching gas through the sound pressure input hole, the acoustic chamber, and the etching holes.

6. An acoustic sensor, comprising:

a printed circuit board on which a sound pressure input hole for receiving an external sound pressure is formed;

an acoustic sensor unit coupled to the printed circuit board so as to be exposed through the sound pressure input hole and include a diaphragm vibrated by the external sound pressure, a lower electrode used as a relative electrode of the diaphragm, and a lower electrode support wall supporting the lower electrode; and a cover attached to the printed circuit board so as to cover the acoustic sensor unit, wherein an acoustic chamber is formed between the cover and the diaphragm of the acoustic sensor unit, and wherein the acoustic sensor unit includes a lower electrode support wall defined layer configured to enclose an outer wall of the lower electrode support wall.

7. The acoustic sensor of claim 6, wherein the acoustic sensor unit further includes:

an acoustic chamber defined layer configured disposed outside of the lower electrode support wall defined layer; and an acoustic sensor unit defined layer disposed outside of the acoustic chamber defined layer.

8. The acoustic sensor of claim 7, wherein the acoustic sensor unit further includes:

a substrate on which the lower electrode support wall, the lower electrode support wall defined layer, the acoustic chamber defined layer, and the acoustic sensor unit defined layer are formed;

a substrate insulating layer disposed on the substrate; and the lower electrode and a lower electrode insulating layer formed on the substrate insulating layer, the substrate insulating layer and the lower electrode being provided with at least one etching hole.

9. The acoustic sensor of claim 6, further comprising:

a signal processing unit coupled to the printed circuit board and electrically connected to the acoustic sensor unit to convert a vibration signal of the diaphragm generated by the external sound pressure into an electrical signal.

10. An acoustic sensor, comprising:

a printed circuit board on which a sound pressure input hole for receiving an external sound pressure is formed;

an acoustic sensor unit coupled to the printed circuit board so as to be exposed through the sound pressure input hole and include a diaphragm vibrated by the external sound pressure, a lower electrode used as a relative electrode of the diaphragm, and a lower electrode support wall supporting the lower electrode;

a signal processing unit coupled to the printed circuit board and electrically connected to the acoustic sensor unit to convert a vibration signal of the diaphragm generated by the external sound pressure into an electrical signal; and a cover attached to the printed circuit board so as to cover the acoustic sensor unit, wherein an acoustic chamber is formed between the cover and the diaphragm of the acoustic sensor unit.

11. The acoustic sensor of claim 10, wherein the acoustic sensor unit includes:

a lower electrode support wall defined layer configured to enclose an outer wall of the lower electrode support wall;

an acoustic chamber defined layer disposed outside of the lower electrode support wall defined layer; and an acoustic sensor unit defined layer disposed outside of the acoustic chamber defined layer.

12. The acoustic sensor of claim 11, wherein the acoustic sensor unit further includes:

a substrate on which the lower electrode support wall, the lower electrode support wall defined layer, the acoustic chamber defined layer, and the acoustic sensor unit defined layer are formed;

a substrate insulating layer disposed on the substrate; and the lower electrode and a lower electrode insulating layer formed on the substrate insulating layer, the substrate insulating layer and the lower electrode being provided with at least one etching hole.

* * * * *